(12) United States Patent
Watanabe et al.

(10) Patent No.: US 11,747,215 B2
(45) Date of Patent: Sep. 5, 2023

(54) TEMPERATURE MEASURING DEVICE

(71) Applicant: NIPPON MEKTRON, LTD., Tokyo (JP)

(72) Inventors: Tsukasa Watanabe, Tokyo (JP); Shunsuke Tomita, Tokyo (JP); Shuzo Yamada, Tokyo (JP); Kenji Kiya, Tokyo (JP)

(73) Assignee: NIPPON MEKTRON, LTD., Tokyo (JP)

(*) Notice: Subject to any disclaimer, the term of this patent is extended or adjusted under 35 U.S.C. 154(b) by 224 days.

(21) Appl. No.: 17/338,829

(22) Filed: Jun. 4, 2021

(65) Prior Publication Data

US 2022/0042857 A1 Feb. 10, 2022

(30) Foreign Application Priority Data

Aug. 6, 2020 (JP) .................................. 2020-133935

(51) Int. Cl.
*G01K 7/22* (2006.01)
*G01R 31/396* (2019.01)
*G01K 1/16* (2006.01)
*H05K 1/02* (2006.01)
*G01K 1/14* (2021.01)
(Continued)

(52) U.S. Cl.
CPC ................. *G01K 7/22* (2013.01); *G01K 1/14* (2013.01); *G01K 1/16* (2013.01); *G01R 31/396* (2019.01); *H05K 1/028* (2013.01); *G01K 1/08* (2013.01); *G01K 1/18* (2013.01); *G01R 31/382* (2019.01); *H01M 10/486* (2013.01);
(Continued)

(58) Field of Classification Search
CPC .. G01K 7/22; G01K 1/14; G01K 1/16; G01K 1/08; G01K 1/18; G01R 31/396; G01R 31/382; H05K 1/028; H05K 1/189; H05K 2201/10022; H05K 2201/10196; H01M 10/486; Y02E 60/10
See application file for complete search history.

(56) References Cited

U.S. PATENT DOCUMENTS

2011/0024205 A1* 2/2011 Nishihara ............. H01M 10/48
429/90
2014/0017533 A1* 1/2014 Nishihara ........... H01M 50/569
429/93

(Continued)

FOREIGN PATENT DOCUMENTS

JP 2019-074327 A 5/2019

*Primary Examiner* — Nathaniel T Woodward
*Assistant Examiner* — Philip L Cotey
(74) *Attorney, Agent, or Firm* — Studebaker & Brackett PC

(57) ABSTRACT

Provided is a temperature measuring device which includes: a flexible printed circuit board with wiring; a thermistor element; a heat collecting plate; and a pressing member. The flexible printed circuit board is configured to be attached to a case that is fixed to an object to be measured, the thermistor element is electrically connected to the wiring, the heat collecting plate is disposed on a side opposite to the thermistor element via the flexible printed circuit board so as to be pressed against a temperature measuring point in the object to be measured, and the pressing member is made of a foam material and is configured to be compressed when the case is fixed to the object to be measured and to press the heat collecting plate against the object to be measured.

7 Claims, 11 Drawing Sheets

(51) Int. Cl.
*G01K 1/18* (2006.01)
*H01M 10/48* (2006.01)
*H05K 1/18* (2006.01)
*G01R 31/382* (2019.01)
*G01K 1/08* (2021.01)

(52) U.S. Cl.
CPC ... *H05K 1/189* (2013.01); *H05K 2201/10022* (2013.01); *H05K 2201/10196* (2013.01); *Y02E 60/10* (2013.01)

(56) References Cited

U.S. PATENT DOCUMENTS

| | | | |
|---|---|---|---|
| 2018/0034115 A1* | 2/2018 | Li | G01K 1/16 |
| 2019/0025134 A1* | 1/2019 | Ju | G01K 1/14 |
| 2019/0237817 A1* | 8/2019 | Hammerschmied | H01M 10/425 |
| 2020/0333192 A1* | 10/2020 | Takase | G01K 1/14 |
| 2020/0408607 A1* | 12/2020 | Yee | G01K 1/14 |
| 2021/0111442 A1* | 4/2021 | Cao | H01M 10/0481 |
| 2021/0111444 A1* | 4/2021 | Wang | H01M 50/543 |
| 2021/0265677 A1* | 8/2021 | Guo | H01M 50/569 |

* cited by examiner

TEMPERATURE MEASURING DEVICE

CROSS-REFERENCE TO RELATED APPLICATION

This application is based on Japanese Patent Application No. 2020-133935 filed with the Japan Patent Office on Aug. 6, 2020, the entire content of which is hereby incorporated by reference.

BACKGROUND

1. Technical Field

The present disclosure relates to a temperature measuring device.

2. Related Art

A temperature measuring device for measuring a temperature of an object to be measured is known. For example, a battery mounted on an electric vehicle or the like is provided with a device for measuring the temperature of the battery. It is necessary that a thermistor element mounting portion is surely in contact with a cell included in the battery of such a device. For example, a method for attaching the thermistor element mounting portion with an adhesive tape is known. However, such a method may cause peeling due to deterioration of an adhesive material. Therefore, this method lacks reliability. Therefore, conventionally, by using a spring such as a coil spring or a leaf spring, a mechanism has been employed in which the thermistor element mounting portion is more reliably pressed against the cell regardless of dimensional tolerances of various members. By employing such a mechanism, the temperature can be stably measured (see JP-A-2019-074327). However, when such a mechanism is employed, the number of parts is increased. Therefore, not only assembly man-hours are increased, but also installation space is increased, so that the cost is also increased. Therefore, a device that measures the temperature more simply and stably is desired.

SUMMARY

A temperature measuring device according to the present embodiment includes: a flexible printed circuit board with wiring; a thermistor element; a heat collecting plate; and a pressing member. The flexible printed circuit board is configured to be attached to a case that is fixed to an object to be measured, the thermistor element is electrically connected to the wiring, the heat collecting plate is disposed on a side opposite to the thermistor element via the flexible printed circuit board so as to be pressed against a temperature measuring point in the object to be measured, and the pressing member is made of a foam material and is configured to be compressed when the case is fixed to the object to be measured and to press the heat collecting plate against the object to be measured.

DETAILED DESCRIPTION

Figure 1:
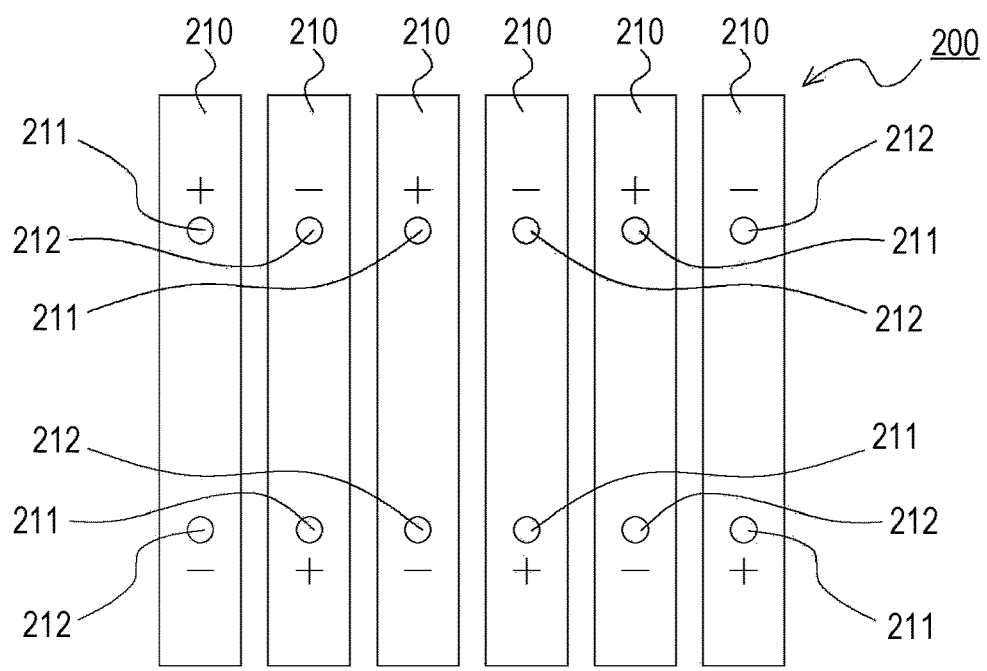
FIG. 1 is a plan view of a battery used in the present embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

An object of the present embodiment is to provide a temperature measuring device capable of reducing the number of parts and stably measuring a temperature.

In this embodiment, the following means are employed to solve the above problems.

Specifically, a temperature measuring device according to the present disclosure includes: a flexible printed circuit board with wiring; a thermistor element; a heat collecting plate; and a pressing member. The flexible printed circuit board is configured to be attached to a case that is fixed to an object to be measured, the thermistor element is electrically connected to the wiring, the heat collecting plate is disposed on a side opposite to the thermistor element via the flexible printed circuit board so as to be pressed against a temperature measuring point in the object to be measured, and the pressing member is made of a foam material and is configured to be compressed when the case is fixed to the object to be measured and to press the heat collecting plate against the object to be measured.

According to this embodiment, the pressing member made of the foam material is compressed by fixing the case to the object to be measured. Thus, the heat collecting plate is pressed against the object to be measured. Then, by simply providing the pressing member, the heat collecting plate can be pressed against the object to be measured with a small number of parts. In addition, the heat collecting plate is pressed against the object to be measured. Therefore, the heat collecting plate can be brought into contact with the object to be measured regardless of dimensional tolerances of various members. Therefore, the temperature can be stably measured.

Further, a temperature measuring device according to another disclosure includes: a flexible printed circuit board with wiring; a thermistor element; and a pressing member, in which the flexible printed circuit board is configured to be attached to a case that is fixed to an object to be measured, the thermistor element is electrically connected to the wiring, and the pressing member is made of a foam material and is configured to be compressed when the case is fixed to the object to be measured and to press the flexible printed circuit board against the object to be measured.

According to this embodiment, the pressing member made of the foam material is compressed by fixing the case to the object to be measured. Thus, the flexible printed circuit board is pressed against the object to be measured. Then, by simply providing the pressing member, the flexible printed circuit board can be pressed against the object to be measured with a small number of parts. In addition, the flexible printed circuit board is pressed against the object to be measured. Therefore, the flexible printed circuit board can be brought into contact with the object to be measured regardless of dimensional tolerances of various members. Therefore, the temperature can be stably measured.

The flexible printed circuit board may have the wiring connected to the thermistor element and a wiring for measuring a voltage of the object to be measured.

This eliminates a need to separately provide a wiring member for voltage measurement and a wiring member for temperature measurement. Therefore, the number of parts can be further reduced.

The pressing member may be configured to have a cavity in which the thermistor element is disposed, and to be fixed to each of the case and the flexible printed circuit board.

The pressing member may preferably have a cavity in which the thermistor element is disposed, include a reinforcing plate fixed to the flexible printed circuit board, and be further fixed to each of the case and the reinforcing plate.

Further, the temperature measuring device may preferably include a reinforcing plate and a lid, and it is preferred that the reinforcing plate have a cavity in which the thermistor element is disposed, and is fixed to the flexible printed circuit board, the lid covers the cavity of the reinforcing plate, and the pressing member is configured to be fixed to each of the case and the lid.

According to such a configuration, it is possible to prevent foreign matter and the like from entering the cavity in which the thermistor element is disposed.

The pressing member is preferably waterproof.

Further, the thermistor element may be preferably embedded in a sealing material.

Note that the above components can be employed in combination as far as possible.

As described above, according to this embodiment, the number of parts can be reduced and stable temperature measurement can be performed.

This embodiment will be described in detail exemplarily below with reference to the drawings. However, unless otherwise specified, dimensions, materials, shapes, relative arrangements, and the like of the components described in this embodiment are not intended to limit the scope of this embodiment only to descriptions of the embodiment.

In the following embodiments, as an example, the temperature measuring device integrally used in a voltage monitoring device attached to a battery mounted on an electric vehicle or the like will be described. However, the temperature measuring device according to this embodiment can be applied to applications for measuring temperatures of various objects to be measured.

<Overview of Battery and Voltage Monitoring Device>

Figure 2:
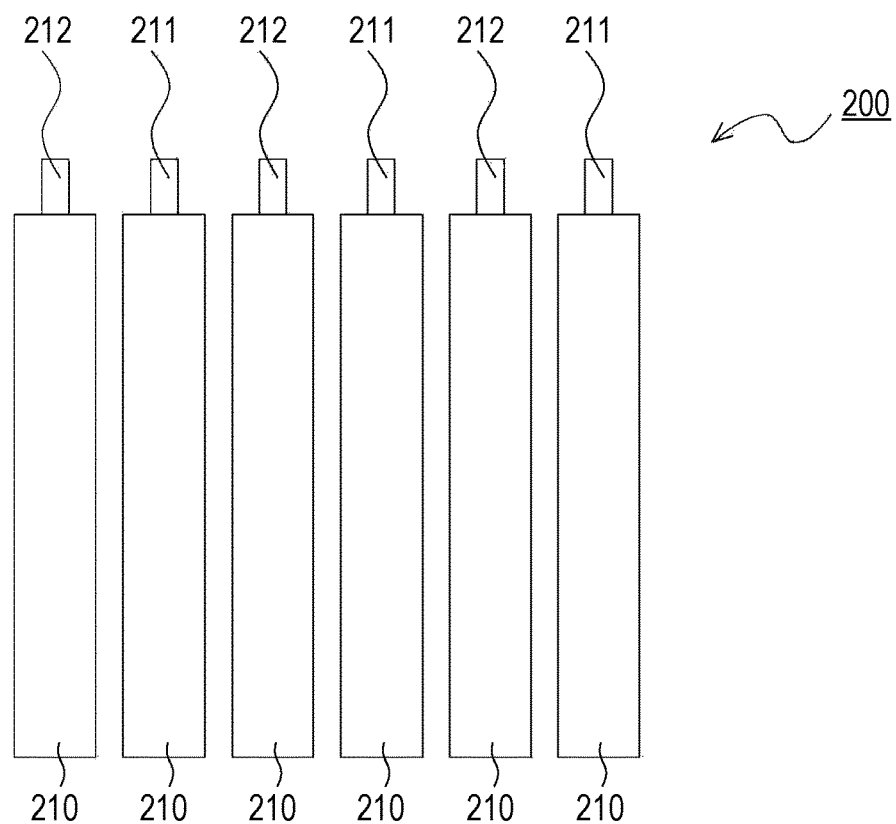
FIG. 2 is a side view of the battery used in this embodiment.
Figure 3:
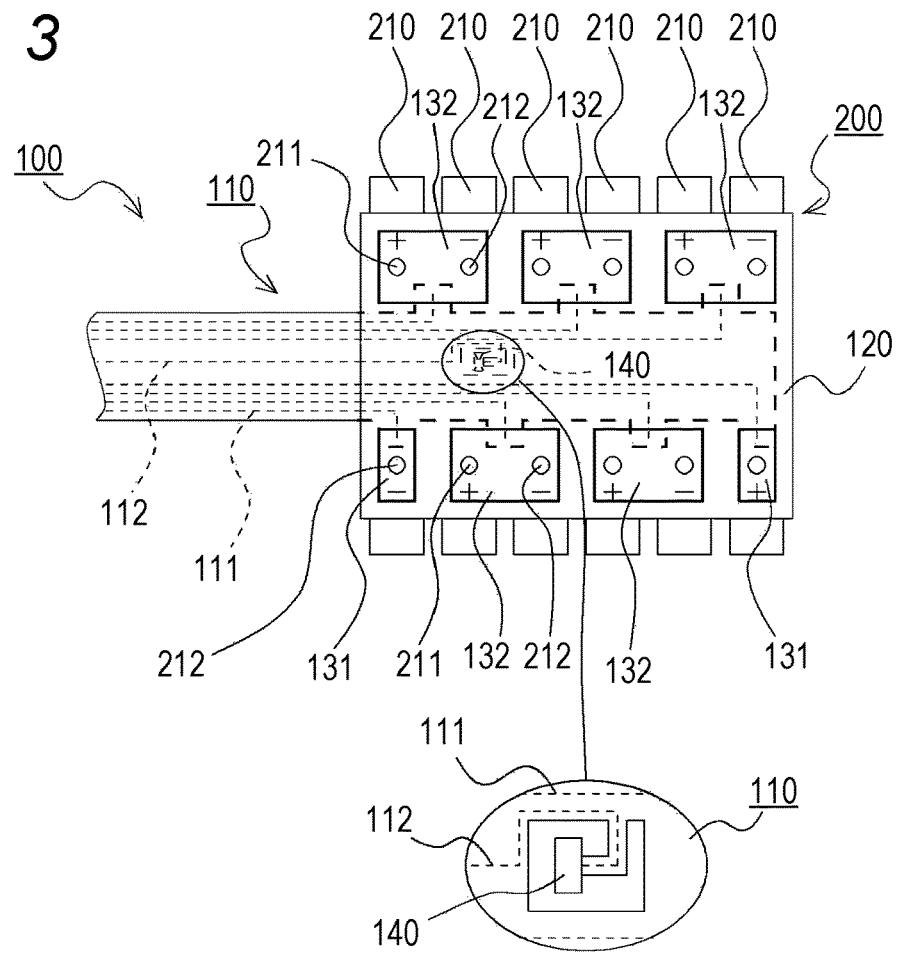
FIG. 3 is a plan view illustrating a voltage monitoring device attached to the battery and used in an embodiment of the present disclosure.
Figure 4:
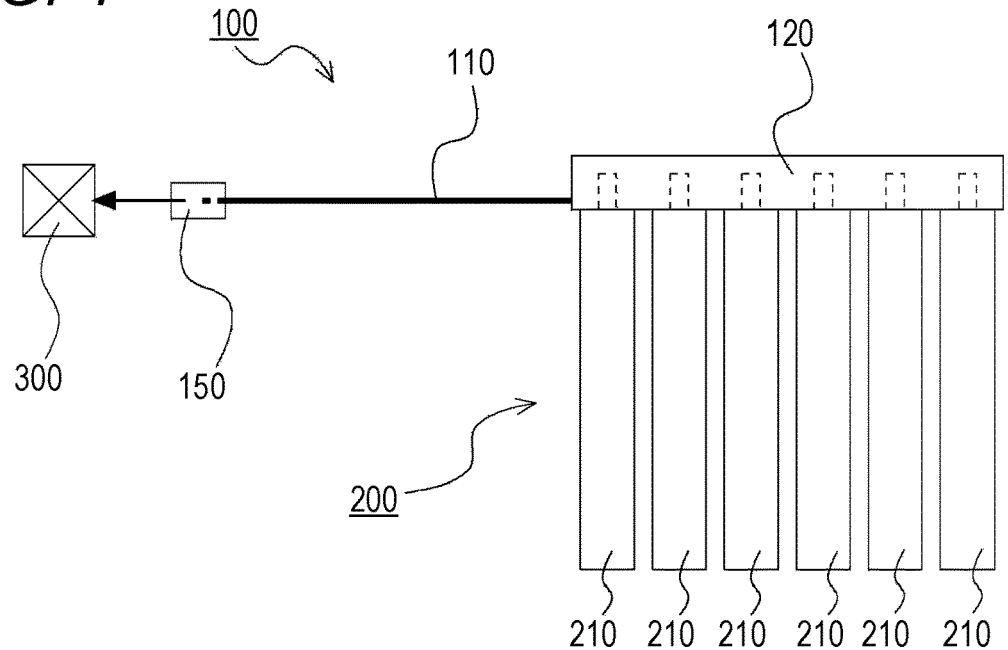
FIG. 4 is a side view illustrating the voltage monitoring device attached to the battery and used in the embodiment of the present disclosure.

Prior to description of the temperature measuring device according to this embodiment, overview of the battery and the voltage monitoring device will be described with reference to FIGS. 1 to 4. FIG. 1 is a plan view (viewed from above) illustrating a schematic configuration of the battery used in this embodiment. FIG. 2 is a side view illustrating a schematic configuration of the battery according to this embodiment. FIG. 3 is a plan view (viewed from above) schematically illustrating the voltage monitoring device used in this embodiment attached to the battery. FIG. 4 is a side view schematically illustrating the voltage monitoring device used in this embodiment attached to the battery.

A battery 200 includes a plurality of cells 210. The cells 210 are arranged so that a positive electrode 211 and a negative electrode 212 are adjacent to each other. Further, in the cells 210, the positive electrode 211 and the negative electrode 212 adjacent to each other are electrically connected by bus bars 131 and 132. Thus, the cells 210 are connected in series. Note that the illustrated embodiment shows the battery 200 including six cells 210 for convenience of explanation. However, the battery mounted on the electric vehicle or the like generally contain more cells.

As illustrated in FIG. 3, a voltage monitoring device 100 includes a flexible printed circuit board (hereinafter referred to as FPC) 110, a case 120 to which the FPC 110 is attached, and the above-mentioned bus bar 131 and 132 attached to the case 120. As illustrated in FIG. 4, a connector 150 is attached to a tip of the FPC 110. That is, the connector 150 connects the measuring device 300 that measures the voltage and temperature of the cell 210 included in the battery 200 and performs various controls, and the FPC 110. Note that FIG. 4 illustrates the embodiment in which one measuring device 300 performs measurement of the voltage and temperature, and the like. However, in another configuration, a wiring of the FPC 110 may be branched into a wiring for voltage measurement and a wiring for temperature measurement. In this case, a connector is provided at each tip of the wirings. Then, one of the connectors is connected to a device for voltage measurement. The other connector is connected to a device for temperature measurement.

Then, as described above, the voltage monitoring device 100 measures not only the voltage but also the temperature. Therefore, a temperature measuring device 140 is provided. FIG. 3 illustrates in an elliptical frame a partially enlarged view of a plan view in the vicinity where the temperature measuring device 140 is provided when the case 120 is removed. The FPC 110 is provided with a wiring 111 for measuring the voltage and a wiring 112 for measuring the temperature. Note that a structure of the FPC 110 belongs to a known technique. Therefore, detailed description thereof will be omitted. Generally, the FPC 110 includes, for example, a base film, a wiring formed by etching a copper foil provided on the base film, and a cover film covering the wiring. Further, the voltages of all cells 210 included in the battery 200 are monitored. On the other hand, it is not necessary to monitor the temperatures of all cells 210. FIG. 3 illustrates a case where the temperature measuring device 140 is provided at only one place. However, in general, the temperatures at a plurality of locations are monitored by the temperature measuring devices provided at the plurality of locations.

As described above, the voltage monitoring device 100 used in this embodiment is a device having both a function as the voltage measuring device and a function as the temperature measuring device. Hereinafter, a plurality of embodiments of the temperature measuring device exhibiting the function as the temperature measuring device will be described.

First Embodiment

Figure 5A:
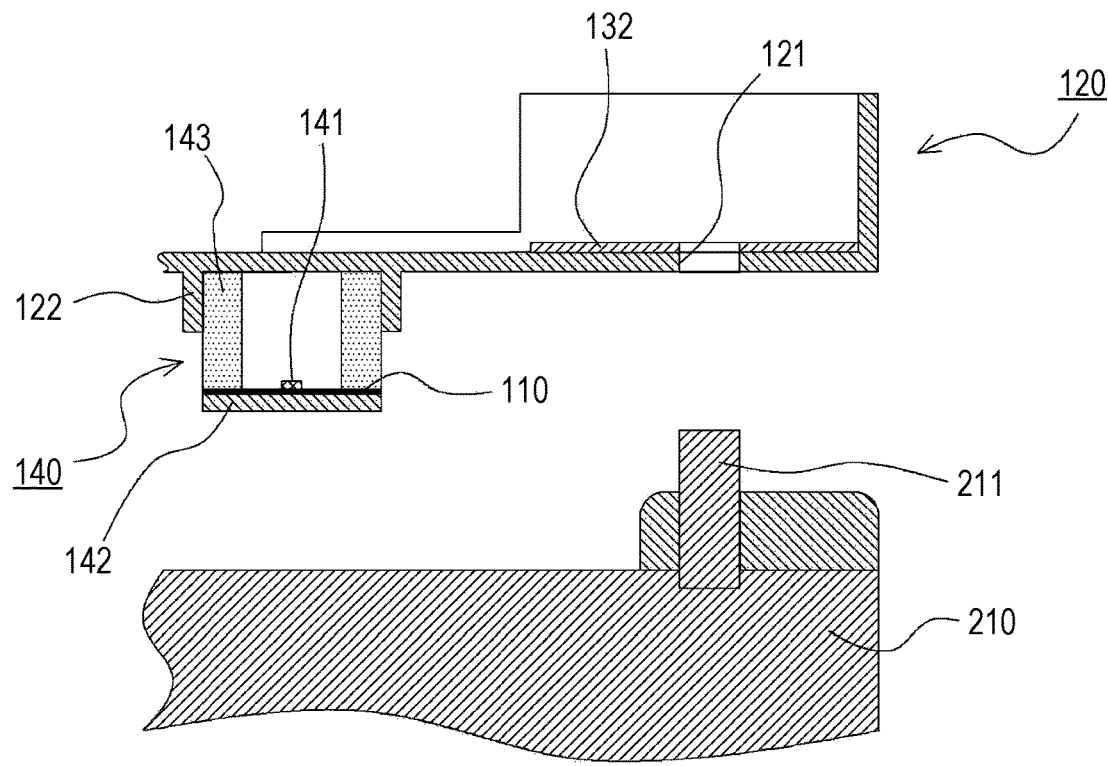
FIGS. 5A and 5B are schematic cross-sectional views of the voltage monitoring device in the vicinity of a temperature measuring device according to a first embodiment.
Figure 5B:
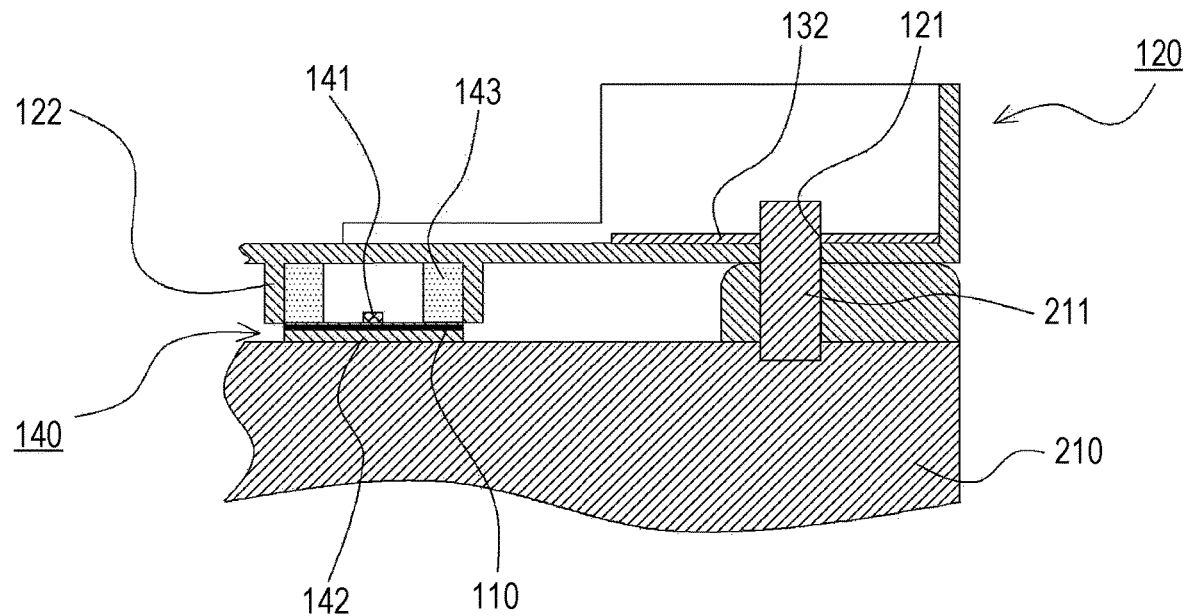
Figure 6A:
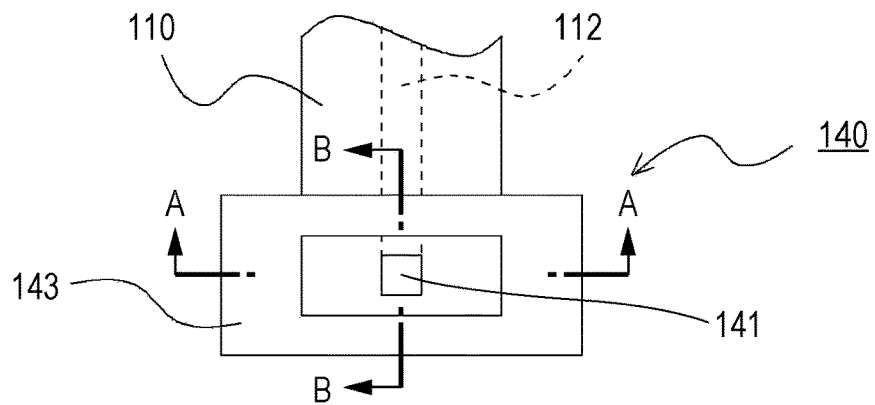
FIGS. 6A to 6C are schematic configuration diagrams of the temperature measuring device according to the first embodiment.
Figure 6B:
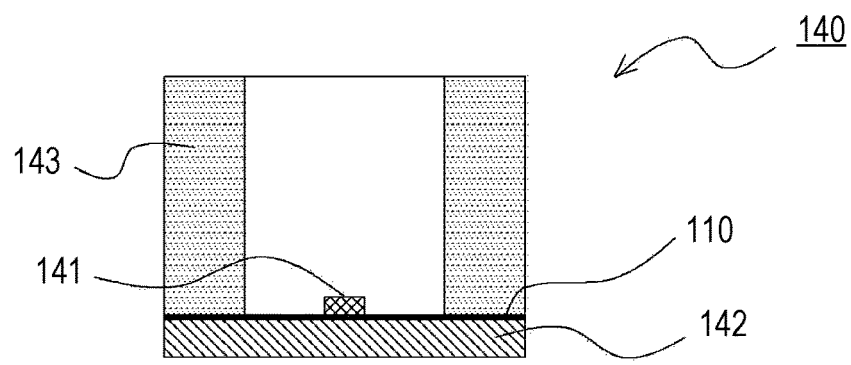
Figure 6C:
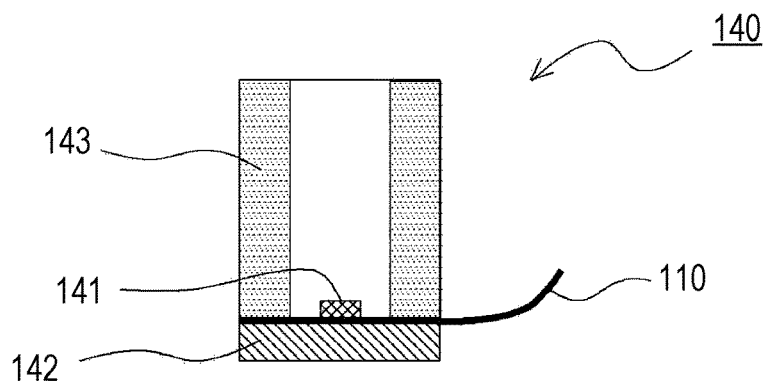

The temperature measuring device according to a first embodiment will be described with reference to FIGS. 5A and 5B and FIGS. 6A to 6C. FIGS. 5A and 5B are schematic cross-sectional views of the voltage monitoring device 100 in the vicinity of the temperature measuring device according to the first embodiment. FIGS. 5A and 5B schematically illustrates a cross-section obtained when the voltage monitoring device 100 and the cell 210 are cut in a longitudinal direction of the cell 210 in the vicinity where the temperature measuring device is provided. Further, FIG. 5A illustrates how the voltage monitoring device 100 is fixed to the battery 200 (cell 210). FIG. 5B illustrates the voltage monitoring device 100 fixed to the battery 200. FIGS. 6A to 6C are schematic configuration diagrams of the temperature measuring device according to the first embodiment. FIG. 6A is a plan view of the temperature measuring device. FIG. 6B is a cross-sectional view taken along a line A-A in FIG. 6A. FIG. 6C is a cross-sectional view taken along a line B-B in FIG. 6A.

The temperature measuring device 140 according to this embodiment includes the above-mentioned FPC 110 configured to be attached to the case 120 and a thermistor element 141 electrically connected to the wiring 112 included in the FPC 110. The case 120 is fixed to the battery 200 (cell 210) that is the object to be measured. The case 120 is provided with an insertion hole 121. The electrode provided in the cell 210 (only the positive electrode 211 is illustrated in FIGS. 5A and 5B) is inserted into the insertion hole 121. The bus bar 132 is provided in the insertion hole 121. As a result, the case 120 is configured such that the electrode and the bus bar 132 are electrically connected.

Further, the temperature measuring device 140 includes a heat collecting plate 142. The heat collecting plate 142 is disposed on the side opposite to the thermistor element 141 via the FPC 110. The heat collecting plate 142 is pressed against the temperature measuring point in the cell 210. The heat collecting plate 142 is made of a plate material such as aluminum. Further, the heat collecting plate 142 can be bonded to the FPC 110 with double-sided tape or the like.

The temperature measuring device 140 according to this embodiment further includes a pressing member 143. The pressing member 143 is configured to be provided between the case 120 and the FPC 110. That is, the pressing member 143 is attached to the case 120 by fitting one end thereof to a fitted portion 122 provided on the case 120. However, as a method for fixing the pressing member 143 to the case 120, various fixing methods can be employed. Further, the other end of the pressing member 143 is fixed to the FPC 110. For example, the other end can be fixed with double-sided tape. Further, the pressing member 143 is made of, for example, the foam material. As the foam material, a foam rubber-based material or a urethane foam-based material can be preferably used.

The pressing member 143 configured as described above is compressed when the case 120 is fixed to the battery 200 (cell 210), and exhibits a function of pressing the heat collecting plate 142 against the battery 200 (see FIG. 5B). Note that the pressing member 143 used in this embodiment is made of a tubular member. The thermistor element 141 is disposed in the cavity in the cylinder. However, the pressing member 143 does not have to be the tubular member. The thermistor element 141 may be disposed in a cavity formed as a recess in a part of the pressing member 143.

Advantages of Temperature Measuring Device According to this Embodiment

According to the temperature measuring device (temperature measuring device 140) according to this embodiment, the pressing member 143 made of the foam material is compressed when the case 120 is fixed to the battery 200 (cell 210), and presses the heat collecting plate 142 against the battery 200. Then, the heat collecting plate 142 can be pressed against the battery 200 with a small number of parts only by providing the pressing member 143 between the case 120 and the FPC 110. Further, the heat collecting plate 142 is pressed against the battery 200. Therefore, the heat collecting plate 142 can be brought into contact with the battery 200 regardless of the dimensional tolerances of the various members. Therefore, the temperature can be stably measured. As described above, with the temperature measuring device according to this embodiment, it is possible to reduce the number of parts and stably measure the temperature. Further, since the number of parts can be reduced, not only assembly man-hours can be reduced, but also the cost can be reduced.

Further, in this embodiment, the FPC 110 has a plurality of wirings. For example, in addition to the wiring 112 connected to the thermistor element 141, the wiring 111 for measuring the voltage of the battery 200 is provided. Therefore, it is not necessary to separately provide the wiring member for voltage measurement and the wiring member for temperature measurement. Therefore, the number of parts can be further reduced. Further, with the temperature measuring device according to this embodiment, the case 120 and various members constituting the temperature measuring device 140 including the FPC 110 can be integrated. Then, this integrated unit product can be attached to the battery 200. Therefore, mounting work and the like are easy.

Second Embodiment

Figure 7A:
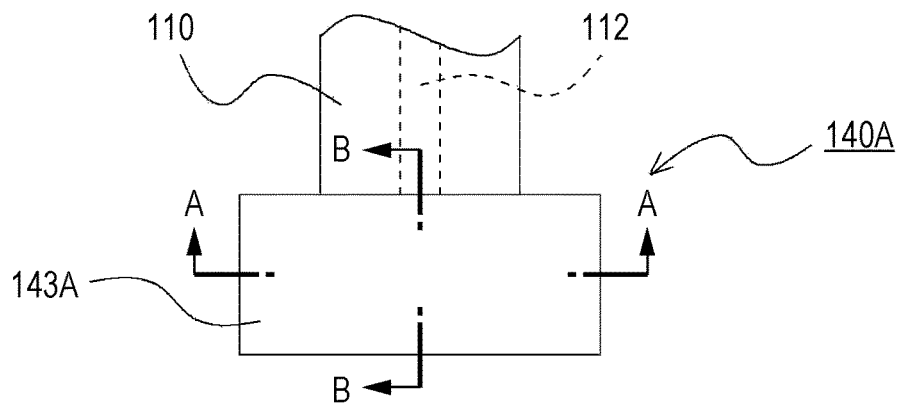
FIGS. 7A to 7C are schematic configuration diagrams of the temperature measuring device according to a second embodiment.
Figure 7B:
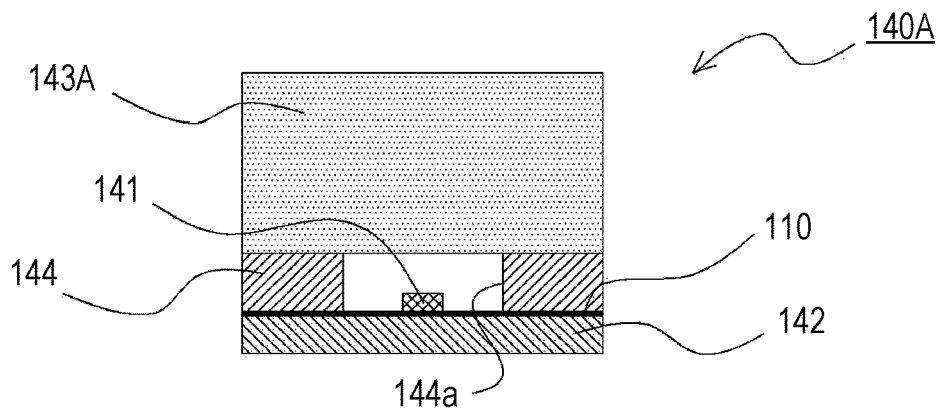
Figure 7C:
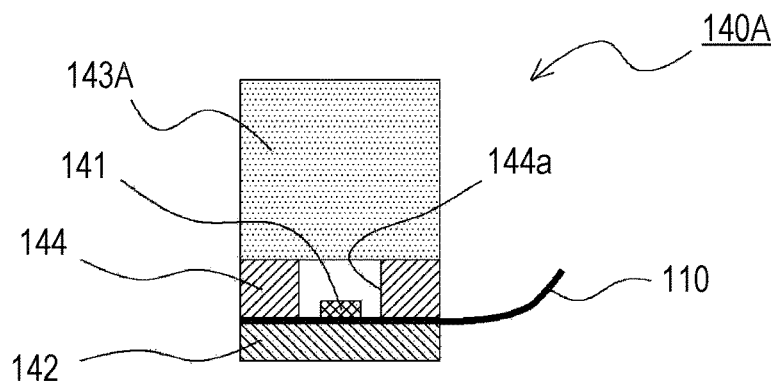

A second embodiment is illustrated in FIGS. 7A to 7C. In this embodiment, configuration of the temperature measuring device different from that of the first embodiment is described. Basic configuration and operation are the same as those of the first embodiment. Therefore, the same components are denoted by the same reference numerals, and description thereof will be omitted.

FIGS. 7A to 7C are schematic configuration diagrams of the temperature measuring device according to the second embodiment. FIG. 7A is a plan view of the temperature measuring device. FIG. 7B is a cross-sectional view taken along a line A-A in FIG. 7A, and FIG. 7C is a cross-sectional view taken along a line B-B in FIG. 7A.

In this embodiment, only a temperature measuring device 140A has a configuration different from that of the temperature measuring device 140 of the first embodiment. Other configurations of the case 120 and the like are the same as those of the first embodiment. Therefore, the description thereof will be omitted.

As in the first embodiment, the temperature measuring device 140A according to this embodiment also includes the FPC 110, the thermistor element 141 electrically connected to the wiring 112 included in the FPC 110, and the heat collecting plate 142.

The temperature measuring device 140A according to this embodiment also includes a pressing member 143A configured to be provided between the case 120 and the FPC 110. Then, the temperature measuring device 140A according to this embodiment includes a reinforcing plate 144 fixed to the FPC 110. Note that as a material of the reinforcing plate 144, various materials such as metal and resin can be employed. The reinforcing plate 144 is made of the tubular member. A cavity is defined by an inner peripheral surface 144a of the reinforcing plate 144. Then, the thermistor element 141 is disposed in this cavity. The pressing member 143A is configured to be fixed to each of the case 120 and the reinforcing plate 144. The method for fixing the pressing member 143A to the case 120 is as described in the first embodiment. Further, as an example of the method for fixing the pressing member 143A to the reinforcing plate 144, fixing with double-sided tape can be mentioned. As in the first embodiment, the pressing member 143A is made of the foam material.

The same effect as that of the first embodiment can also be obtained by the temperature measuring device according to this embodiment configured as described above. When it is desired to reduce a thickness of the pressing member 143A, the thickness of the pressing member 143A can be adjusted by employing the reinforcing plate 144 as in this embodiment. Further, in this embodiment, the thermistor element 141 is disposed in the cavity provided in the reinforcing plate 144. Therefore, it is not necessary to provide the pressing member 143A with the cavity. However, depending on an elastic rebound force required when the pressing member 143A is compressed, the tubular member may be employed as the pressing member 143A as in the first embodiment.

Third Embodiment

Figure 8A:
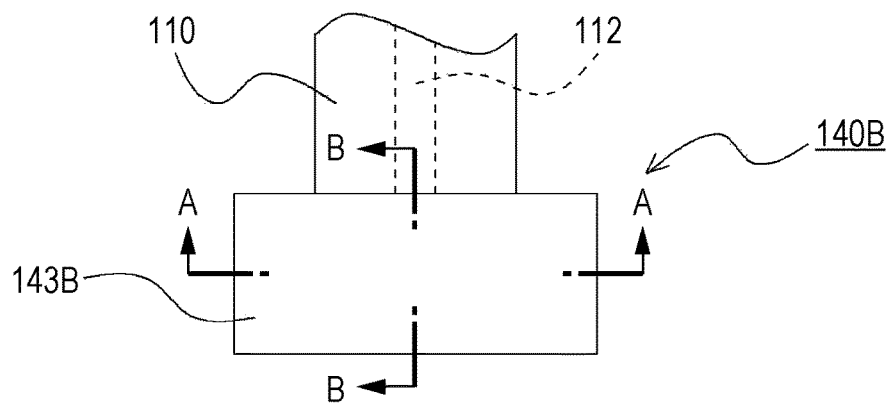
FIGS. 8A to 8C are schematic configuration diagrams of the temperature measuring device according to a third embodiment.
Figure 8B:
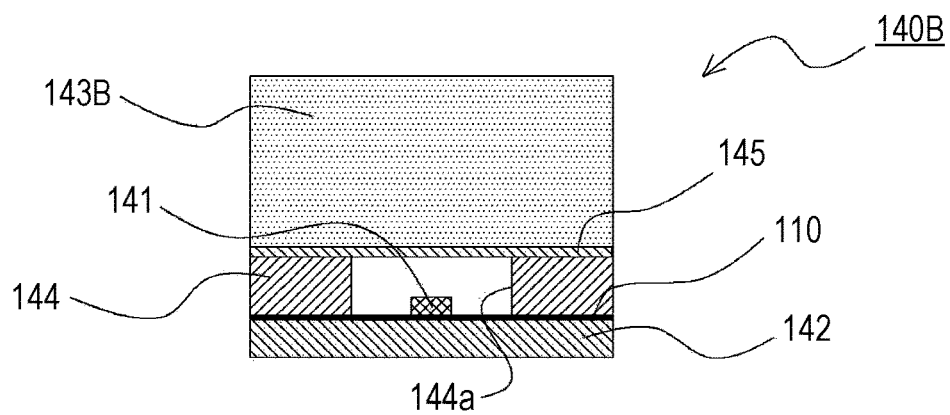
Figure 8C:
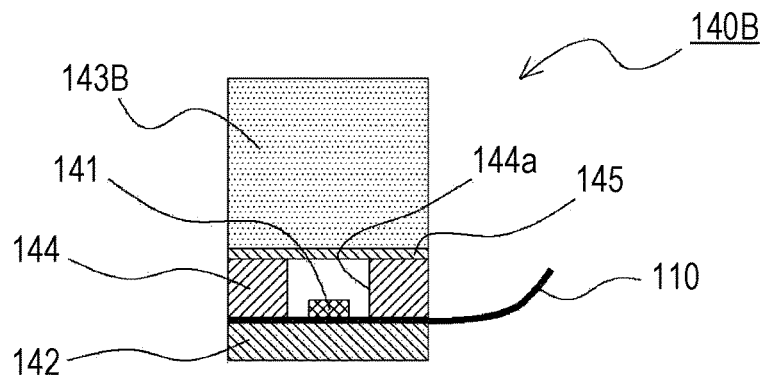

FIGS. 8A-8C illustrate a third embodiment of the present disclosure. In this embodiment, the configuration of the temperature measuring device different from that of the first embodiment is described. The basic configuration and operation are the same as those of the first embodiment. Therefore, the same components are denoted by the same reference numerals, and the description thereof will be omitted.

FIGS. 8A to 8C are schematic configuration diagrams of the temperature measuring device according to the third embodiment of the present disclosure. FIG. 8A is a plan view of the temperature measuring device. FIG. 8B is a cross-sectional view taken along a line A-A in FIG. 8A. FIG. 8C is a cross-sectional view taken along a line B-B in FIG. 8A.

In this embodiment, only a temperature measuring device 140B has a configuration different from that of the temperature measuring device 140 of the first embodiment. The other configurations of the case 120 and the like are the same as those of the first embodiment. Therefore, the description thereof will be omitted.

As in the first embodiment, the temperature measuring device 140B according to this embodiment also includes the FPC 110, the thermistor element 141 electrically connected to the wiring 112 included in the FPC 110, and the heat collecting plate 142.

The temperature measuring device 140B according to this embodiment also includes a pressing member 143B configured to be provided between the case 120 and the FPC 110. Then, the temperature measuring device 140B according to this embodiment includes the reinforcing plate 144 fixed to the FPC 110 as in the second embodiment. The configuration of the reinforcing plate 144 is as described in the second embodiment. Therefore, the description thereof will be omitted. Then, the temperature measuring device 140B according to this embodiment includes a lid 145 that covers the cavity of the reinforcing plate 144. The lid 145 is made of various materials such as metal or resin, and is fixed to the reinforcing plate 144 with double-sided tape or the like. In this embodiment, the pressing member 143B is configured to be fixed to each of the case 120 and the lid 145. The method for fixing the pressing member 143B to the case 120 is as described in the first embodiment. Further, as an example of the method for fixing the pressing member 143B to the lid 145, the fixing with double-sided tape can be mentioned. As in the first embodiment, the pressing member 143B is made of the foam material.

The same effect as that of the first and second embodiments can also be obtained by the temperature measuring device according to this embodiment configured as described above. Further, in this embodiment, the thermistor element 141 is provided in a sealed space. Therefore, it is possible to prevent water or foreign matter from entering the sealed space. Thus, deterioration of the thermistor element 141 can be suppressed. Note that it is not necessary to provide the cavity in the pressing member 143B, and the tubular member may be employed for the pressing member 143B, as described in the second embodiment.

Fourth Embodiment

Figure 9A:
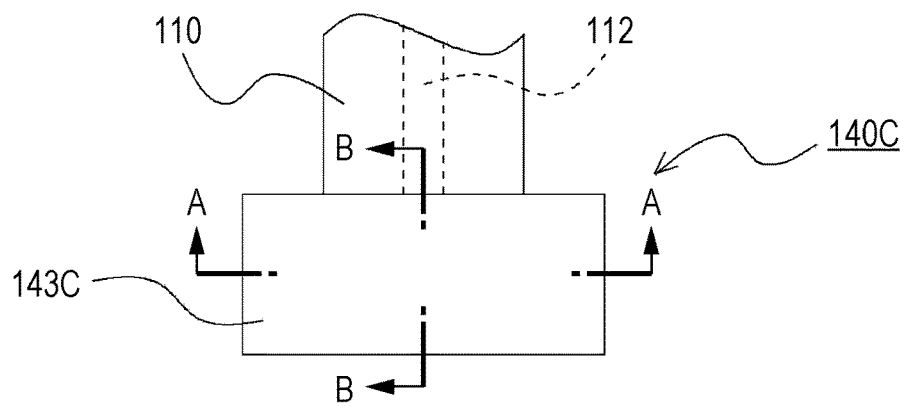
FIGS. 9A to 9C are schematic configuration diagrams of the temperature measuring device according to a fourth embodiment.
Figure 9B:
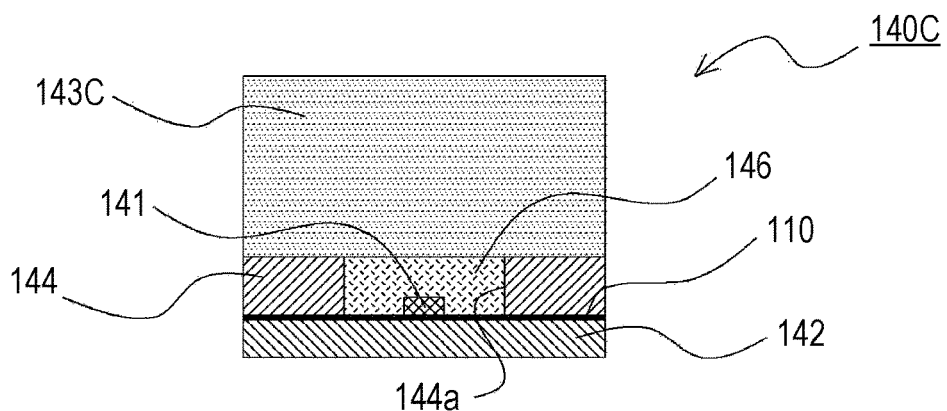
Figure 9C:
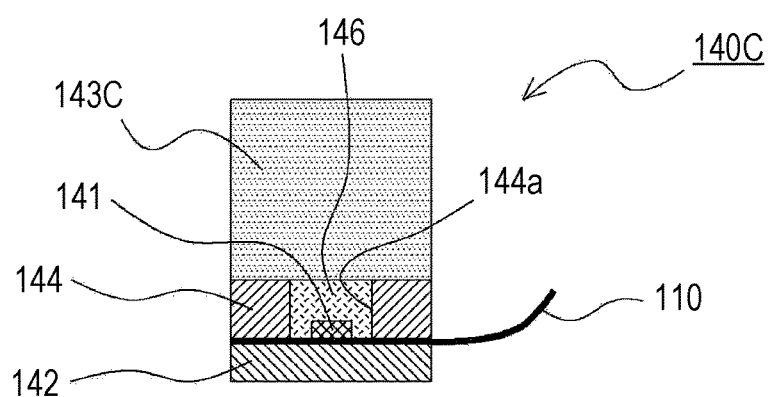

FIGS. 9A-9C illustrate a fourth embodiment. In this embodiment, the configuration of the temperature measuring device different from that of the first embodiment is described. The basic configuration and operation are the same as those of the first embodiment. Therefore, the same components are denoted by the same reference numerals, and the description thereof will be omitted.

FIGS. 9A to 9C are schematic configuration diagrams of the temperature measuring device according to the fourth embodiment. FIG. 9A is a plan view of the temperature measuring device, FIG. 9B is a cross-sectional view taken along a line A-A in FIG. 9A, and FIG. 9C is a cross-sectional view taken along a line B-B in FIG. 9A.

In this embodiment, only a temperature measuring device 140C has a configuration different from that of the temperature measuring device 140 of the first embodiment. The other configurations of the case 120 and the like are the same as those of the first embodiment. Therefore, the description thereof will be omitted.

As in the first embodiment, the temperature measuring device 140C according to this embodiment also includes the FPC 110, the thermistor element 141 electrically connected to the wiring 112 included in the FPC 110, and the heat collecting plate 142.

The temperature measuring device 140C according to this embodiment also includes a pressing member 143C configured to be provided between the case 120 and the FPC 110. Then the temperature measuring device 140C according to this embodiment includes the reinforcing plate 144 fixed to the FPC 110 as in the second embodiment. The configuration of the reinforcing plate 144 is as described in the second embodiment. Therefore, the description thereof will be omitted. Then, in the temperature measuring device 140C according to this embodiment, the cavity of the reinforcing plate 144 is filled with a sealing material 146. Thus, the thermistor element 141 is embedded in the sealing material 146. As the sealing material 146, various materials such as epoxy resin can be employed. In this embodiment, the pressing member 143C is configured to be fixed to each of the case 120 and the reinforcing plate 144. The method for fixing the pressing member 143C to the case 120 is as described in the first embodiment. Further, as an example of the method for fixing the pressing member 143C to the reinforcing plate 144, the fixing with double-sided tape can be mentioned. As in the first embodiment, the pressing member 143C is made of the foam material.

The same effect as that of the first and second embodiments can also be obtained by the temperature measuring device according to this embodiment configured as described above. Further, in this embodiment, the thermistor element 141 is embedded in the sealing material 146. Therefore, it is possible to prevent water or foreign matter from adhering to the thermistor element 141. Thus, the deterioration of the thermistor element 141 can be suppressed. Note that it is not necessary to provide the cavity in the pressing member 143C, and the tubular member may be employed for the pressing member 143C, as described in the second embodiment.

Fifth Embodiment

Figure 10A:
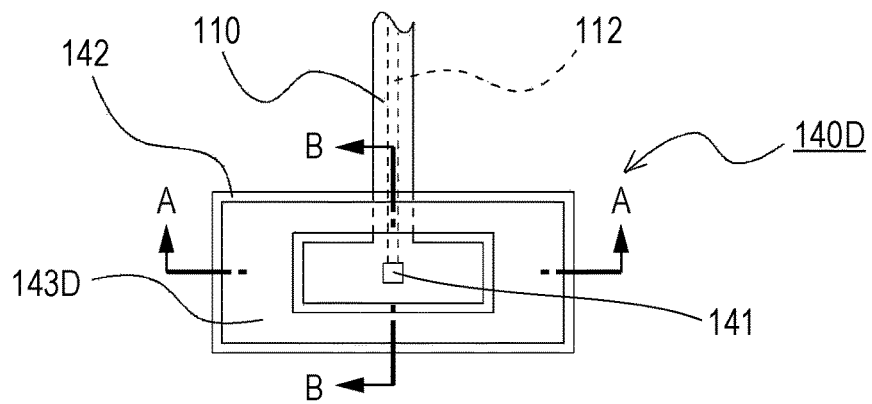
FIGS. 10A to 10C are schematic configuration diagrams of the temperature measuring device according to a fifth embodiment.
Figure 10B:
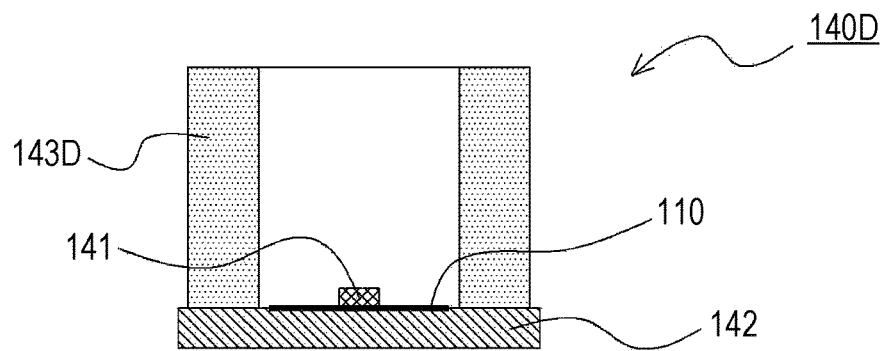
Figure 10C:
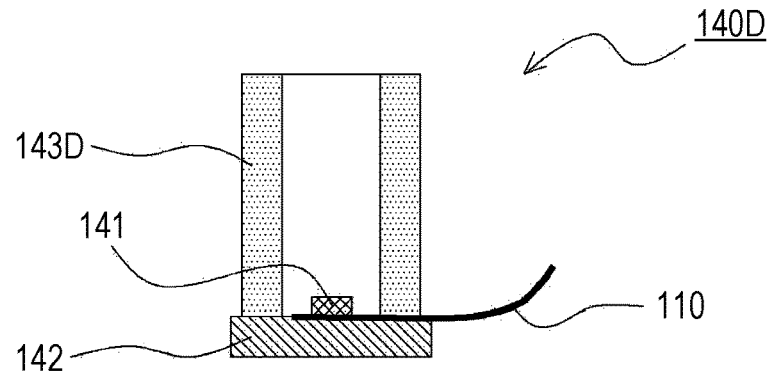

FIGS. 10A to 10C illustrate a fifth embodiment of the present disclosure. In this embodiment, the configuration of the temperature measuring device different from that of the first embodiment is described. The basic configuration and operation are the same as those of the first embodiment. Therefore, the same components are denoted by the same reference numerals, and the description thereof will be omitted.

FIGS. 10A to 10C are schematic configuration diagrams of the temperature measuring device according to the fifth embodiment of the present disclosure. FIG. 10A is a plan view of the temperature measuring device, FIG. 10B is a cross-sectional view taken along a line A-A in FIG. 10A, and FIG. 10C is a cross-sectional view taken along a line B-B in FIG. 10A.

In this embodiment, only a temperature measuring device 140D has a configuration different from that of the temperature measuring device 140 of the first embodiment. The other configurations of the case 120 and the like are the same as those of the first embodiment. Therefore, the description thereof will be omitted.

As in the first embodiment, the temperature measuring device 140D according to this embodiment also includes the FPC 110, the thermistor element 141 electrically connected to the wiring 112 included in the FPC 110, and the heat collecting plate 142.

The temperature measuring device 140D according to this embodiment is configured such that the heat collecting plate 142 is larger than a tip portion of the FPC 110 as compared with the above embodiments. Then, the pressing member 143D is configured to be provided between the case 120 and the FPC 110, and the heat collecting plate 142. The pressing member 143D is made of the tubular member as in the first embodiment. The thermistor element 141 is disposed in the cavity in the tube. However, the pressing member 143D need not be made of the tubular member. The thermistor element 141 may be disposed in a cavity formed as a recess in a part of the pressing member 143D. In this embodiment, the pressing member 143D is configured to be fixed to each of the case 120, the FPC 110, and the heat collecting plate 142. The method for fixing the pressing member 143D to the case 120 is as described in the first embodiment. Further, as an example of the method for fixing the pressing member 143D to the FPC 110 and the heat collecting plate 142, the fixing with double-sided tape can be mentioned. As in the first embodiment, the pressing member 143D is made of the foam material.

As described above, the configuration of the temperature measuring device according to this embodiment is different from the configuration of the temperature measuring device according to the first embodiment in that the pressing member 143D is disposed at a position to directly press both the FPC 110 and the heat collecting plate 142. It is needless to say that the temperature measuring device according to this embodiment configured as described above can also obtain the same effect as that of the first embodiment. Note that this embodiment can also employ a configuration including the reinforcing plate described in the second embodiment, a configuration including the reinforcing plate and the lid described in the third embodiment, or a configuration including the reinforcing plate and the cavity filled with the sealing material of the reinforcing plate described in the fourth embodiment. When these configurations are employed, the reinforcing plate directly presses both the FPC 110 and the heat collecting plate 142.

Sixth Embodiment

Figure 11A:
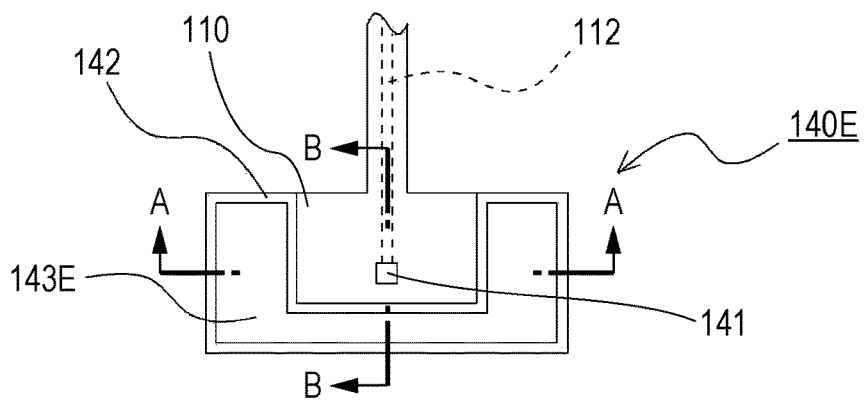
FIGS. 11A to 11C are schematic configuration diagrams of the temperature measuring device according to a sixth embodiment.
Figure 11B:
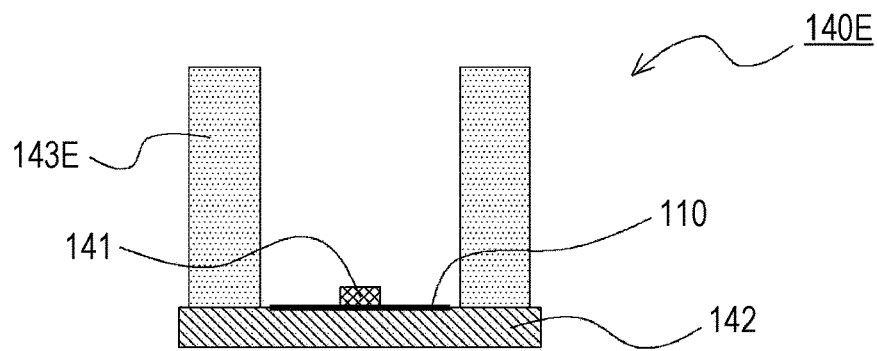
Figure 11C:
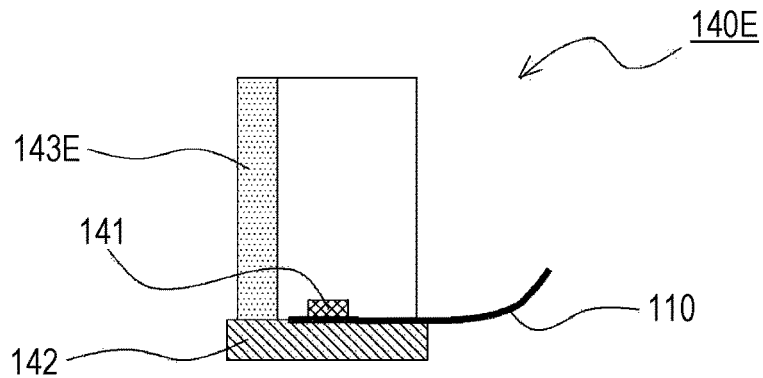

FIGS. 11A-11C illustrate a sixth embodiment of the present disclosure. In this embodiment, the configuration of the temperature measuring device different from that of the first embodiment is described. The basic configuration and operation are the same as those of the first embodiment. Therefore, the same components are denoted by the same reference numerals, and the description thereof will be omitted.

FIGS. 11A to 11C are schematic configuration diagrams of the temperature measuring device according to the sixth embodiment of the present disclosure. FIG. 11A is a plan view of the temperature measuring device. FIG. 11B is a cross-sectional view taken along a line A-A in FIG. 11A. FIG. 11C is a cross-sectional view taken along a line B-B in FIG. 11A.

In the temperature measuring device according to this embodiment, only a configuration of a temperature measuring device 140E is different from that of the first embodiment, and the other configurations of the case 120 and the like are the same as those of the first embodiment. Therefore, the description thereof will be omitted.

As in the first embodiment, the temperature measuring device 140E according to this embodiment also includes the FPC 110, the thermistor element 141 electrically connected to the wiring 112 included in the FPC 110, and the heat collecting plate 142.

In the temperature measuring device 140E according to this embodiment, the heat collecting plate 142 is configured to be larger than the tip portion of the FPC 110 as compared with the first to fourth embodiments. Then, the temperature measuring device 140E according to this embodiment is configured such that the pressing member 143E is provided between the case 120 and the heat collecting plate 142. The pressing member 143E surrounds a part of the tip of the FPC 110. In this embodiment, the pressing member 143E is configured to be fixed to each of the case 120 and the heat collecting plate 142. The method for fixing the pressing member 143E to the case 120 is as described in the first embodiment. Further, as an example of the method for fixing the pressing member 143E to the heat collecting plate 142, the fixing with double-sided tape can be mentioned. As in the first embodiment, the pressing member 143E is made of the foam material.

As described above, in the temperature measuring device according to this embodiment, the pressing member 143E is not in contact with the FPC 110. Further, the pressing member 143E is disposed at a position to directly press only the heat collecting plate 142. In these respects, the configuration of the temperature measuring device according to this embodiment is different from the configuration of the temperature measuring device according to the first embodiment. It is needless to say that the same effect as that of the first embodiment can also be obtained by the temperature measuring device according to this embodiment configured as described above. Note that this embodiment can also employ the configuration including the reinforcing plate described in the second embodiment. That is, the configuration including the reinforcing plate provided between the heat collecting plate 142 and the pressing member 143E can be employed. When such a configuration is employed, the reinforcing plate directly presses the heat collecting plate 142.

Seventh Embodiment

Figure 12A:
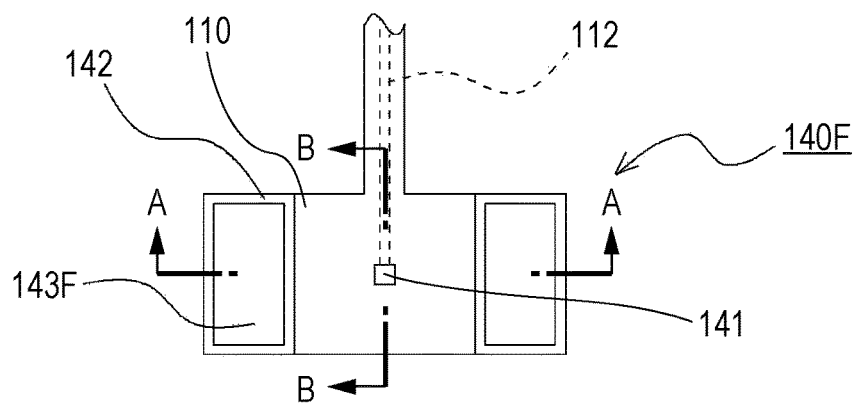
FIGS. 12A to 12C are schematic configuration diagrams of the temperature measuring device according to a seventh embodiment.
Figure 12B:
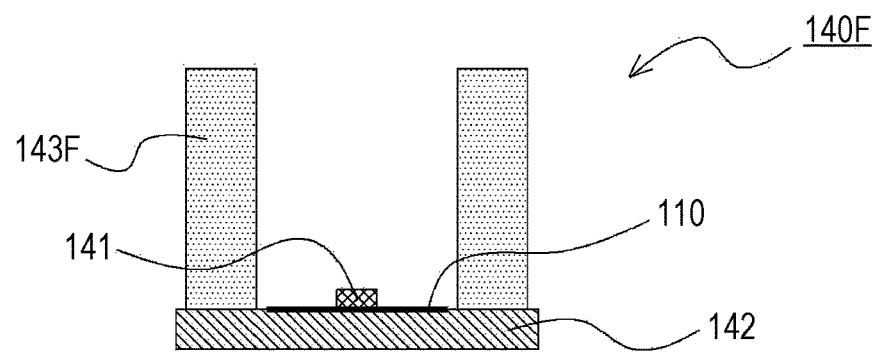
Figure 12C:
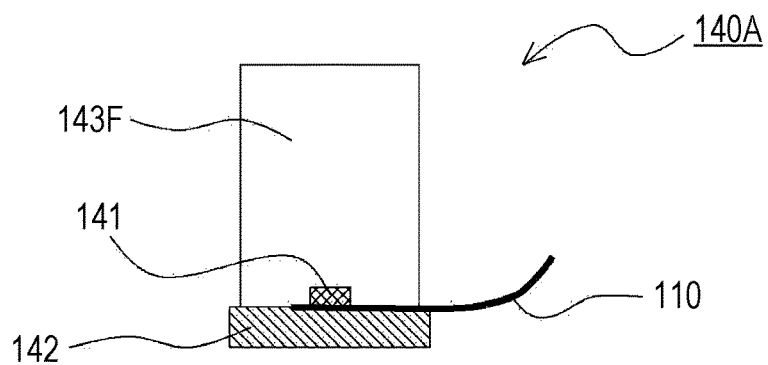

FIGS. 12A to 12C illustrate a seventh embodiment of the present disclosure. In this embodiment, the configuration of the temperature measuring device different from that of the first embodiment is described. The basic configuration and operation are the same as those of the first embodiment. Therefore, the same components are denoted by the same reference numerals, and the description thereof will be omitted.

FIGS. 12A to 12C are schematic configuration diagrams of the temperature measuring device according to the seventh embodiment of the present disclosure. FIG. 12A is a plan view of the temperature measuring device. FIG. 12B is a cross-sectional view taken along a line A-A in FIG. 12A. FIG. 12C is a cross-sectional view taken along a line B-B in FIG. 12A.

In this embodiment, only a temperature measuring device 140F has a configuration different from that of the temperature measuring device 140 of the first embodiment. The other configurations of the case 120 and the like are the same as those of the first embodiment. Therefore, the description thereof will be omitted.

As in the first embodiment, the temperature measuring device 140F according to this embodiment also includes the FPC 110, the thermistor element 141 electrically connected to the wiring 112 included in the FPC 110, and the heat collecting plate 142.

The temperature measuring device 140F according to this embodiment is configured such that the heat collecting plate 142 is larger than the tip portion of the FPC 110 as compared with the first to fourth embodiments. Then, the temperature measuring device 140F according to this embodiment is configured such that two pressing members 143F are provided between the case 120 and the heat collecting plate 142. The pressing members 143F are respectively provided on both sides of the tip of the FPC 110. In this embodiment, the pressing members 143F are respectively configured to be fixed to the case 120 and the heat collecting plate 142. The method for fixing the pressing member 143F to the case 120 is as described in the first embodiment. Further, as an example of the method for fixing the pressing member 143F to the heat collecting plate 142, the fixing with double-sided tape can be mentioned. As in the first embodiment, the pressing member 143F is made of the foam material.

As described above, in the temperature measuring device according to this embodiment, the pressing member 143F is not in contact with the FPC 110. Further, the pressing member 143F is disposed at a position to directly press only the heat collecting plate 142. In these respects, the configuration of the temperature measuring device according to this embodiment is different from that of the first embodiment. It is needless to say that the same effect as that of the first embodiment can also be obtained by the temperature measuring device according to this embodiment configured as described above. Note that this embodiment can also employ the configuration including the reinforcing plate described in the second embodiment. That is, the configuration including the reinforcing plate provided between the heat collecting plate 142 and the pressing member 143F can be employed. When such a configuration is employed, the reinforcing plate directly presses the heat collecting plate 142.

Eighth Embodiment

Figure 13A:
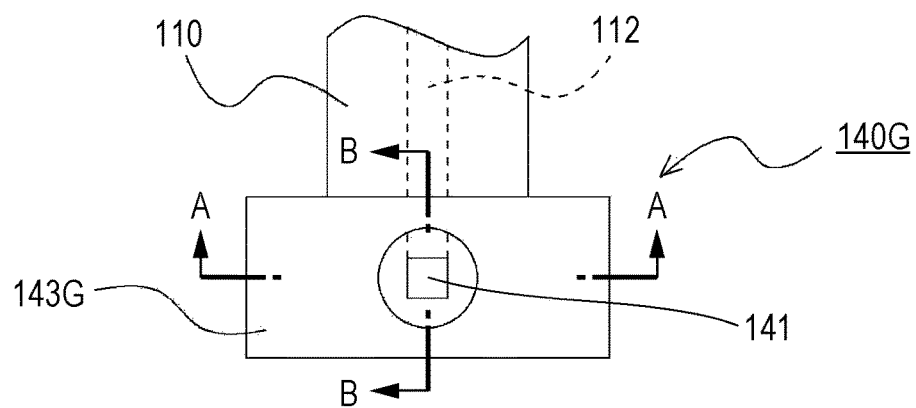
FIGS. 13A to 13C are schematic configuration diagrams of the temperature measuring device according to an eighth embodiment.
Figure 13B:
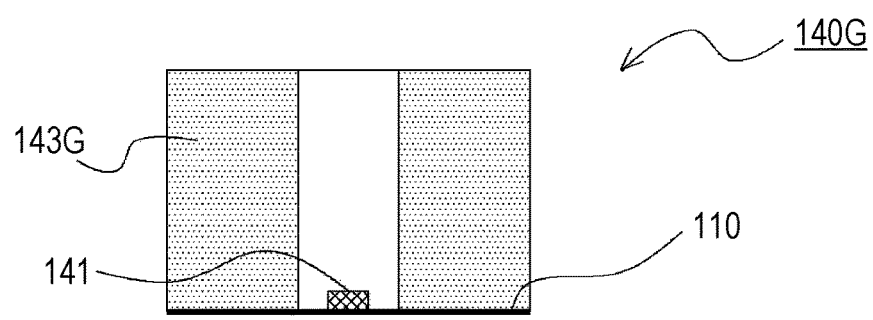
Figure 13C:
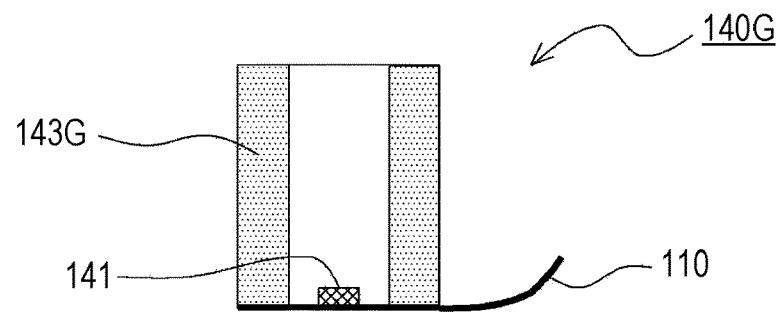

FIGS. 13A to 13C illustrate an eighth embodiment of the present disclosure. In this embodiment, the configuration of the temperature measuring device different from that of the first embodiment is described. The basic configuration and operation are the same as those of the first embodiment. Therefore, the same components are denoted by the same reference numerals, and the description thereof will be omitted.

FIGS. 13A to 13C are schematic configuration diagrams of the temperature measuring device according to the eighth embodiment of the present disclosure. FIG. 13A is a plan view of the temperature measuring device. FIG. 13B is a cross-sectional view taken along a line A-A in FIG. 13A. FIG. 13C is a cross-sectional view taken along a line B-B in FIG. 13A.

In this embodiment, only the temperature measuring device 140G has a configuration different from temperature measuring device 140 of the first embodiment. The other configurations of the case 120 and the like are the same as those of the first embodiment. Therefore, the description thereof will be omitted.

As in the first embodiment, the temperature measuring device 140G according to this embodiment also includes the FPC 110 and the thermistor element 141 electrically connected to the wiring 112 included in the FPC 110. However, unlike the above embodiments, the temperature measuring device 140G according to this embodiment does not include the heat collecting plate.

The temperature measuring device 140G according to this embodiment also includes a pressing member 143G configured to be provided between the case 120 and the FPC 110, as in the first embodiment. The pressing member 143G is made of the tubular member as in the first embodiment. The thermistor element 141 is disposed in the cavity in the tube. However, the pressing member 143G need not be made of the tubular member. The thermistor element 141 may be disposed in a cavity formed as a recess in a part of the pressing member 143G. Then, also in this embodiment, as in the first embodiment, the pressing member 143G is configured to be fixed to each of the case 120 and the FPC 110. The method for fixing the pressing member 143G to the case 120 is as described in the first embodiment. Further, as an example of the method for fixing the pressing member 143G to the FPC 110, the fixing with double-sided tape can be mentioned. As in the first embodiment, the pressing member 143G is made of the foam material.

In the temperature measuring device according to this embodiment configured as described above, when the case 120 is fixed to the battery 200 (cell 210), the pressing member 143G made of the foam material is compressed, to press the FPC 110 against the battery 200. Then, the FPC 110 can be pressed against the battery 200 with a small number of parts only by the pressing member 143G provided between the case 120 and the FPC 110. Further, the FPC 110 is pressed by the battery 200. Therefore, the FPC 110 can be brought into contact with the battery 200 regardless of the dimensional tolerances of the various members. Therefore, the temperature can be stably measured. As described above, the same effect as that of the first embodiment can also be obtained by the temperature measuring device according to this embodiment.

Note that this embodiment can also employ a configuration including the reinforcing plate described in the second embodiment, a configuration including the reinforcing plate and the lid described in the third embodiment, or a configuration including the reinforcing plate described in the fourth embodiment and the cavity filled with the sealing material of the reinforcing plate. When these configurations are employed, the reinforcing plate directly presses the FPC 110.

(Others)

In the embodiments 1 to 5 and 8, it is preferred that the pressing members 143, 143A, 143B, 143C, 143D, and 140G made of the foam material are waterproof (have waterproofness). Thus, the pressing members 143, 143A, 143B, 143C, 143D, and 140G exert a waterproof function. Therefore, it is possible to prevent water from adhering to the thermistor element 141. Specifically, in the first and second embodiments, waterproofness can be obtained with a simple configuration without providing the lid 145 as in the third embodiment and the sealing material 146 as in the fourth embodiment. Note that the foamed material includes a material having closed cells in a foamed state and a material having open cells in the foamed state. By adopting the former foam material as the foam material, it is possible to achieve the waterproof function.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A temperature measuring device comprising:
a flexible printed circuit board with wiring;
a thermistor element;
a heat collecting plate;
a pressing member;
a reinforcing plate; and
a lid, wherein
the flexible printed circuit board is configured to be attached to a case that is fixed to an object to be measured,
the thermistor element is electrically connected to the wiring,
the heat collecting plate is disposed on a side opposite to the thermistor element via the flexible printed circuit board so as to be pressed against a temperature measuring point in the object to be measured,
the pressing member is made of a foam material and is configured to be compressed when the case is fixed to the object to be measured and to press the heat collecting plate against the object to be measured,
the reinforcing plate has a cavity in which the thermistor element is disposed, and is fixed to the flexible printed circuit board,
the lid covers the cavity and an entire top surface of the reinforcing plate, and
the pressing member is configured to be fixed to each of the case and the lid.

2. The temperature measuring device according to claim 1, wherein the flexible printed circuit board has the wiring connected to the thermistor element and a wiring for measuring a voltage of the object to be measured.

3. The temperature measuring device according to claim 1, wherein the pressing member is configured to have a cavity in which the thermistor element is disposed, and to be fixed to each of the case and the flexible printed circuit board.

4. The temperature measuring device according to claim 1, wherein the pressing member is waterproof.

5. A temperature measuring device comprising:
a flexible printed circuit board with wiring;
a thermistor element;
a heat collecting plate; and
a pressing member, wherein
the flexible printed circuit board is configured to be attached to a case that is fixed to an object to be measured,
the thermistor element is electrically connected to the wiring,
the heat collecting plate is disposed on a side opposite to the thermistor element via the flexible printed circuit board so as to be pressed against a temperature measuring point in the object to be measured,
the pressing member is made of a foam material and is configured to be compressed when the case is fixed to the object to be measured and to press the heat collecting plate against the object to be measured, and
the pressing member is directly disposed on the heat collecting plate without being in contact with the flexible printed circuit board.

6. The temperature measuring device according to claim 5, wherein the flexible printed circuit board has the wiring connected to the thermistor element and a wiring for measuring a voltage of the object to be measured.

7. The temperature measuring device according to claim 5, wherein the pressing member is waterproof.

* * * * *